US012664331B2

(12) United States Patent
Langer

(10) Patent No.: US 12,664,331 B2
(45) Date of Patent: Jun. 23, 2026

(54) UNPACK TRIGGER FOR TESTING ELECTRONIC CONTROL UNITS

(71) Applicant: dSPACE GmbH, Paderborn (DE)

(72) Inventor: Sebastian Langer, Paderborn (DE)

(73) Assignee: DSPACE GMBH, Paderborn (DE)

( * ) Notice: Subject to any disclaimer, the term of this patent is extended or adjusted under 35 U.S.C. 154(b) by 986 days.

(21) Appl. No.: 17/886,479

(22) Filed: Aug. 12, 2022

(65) Prior Publication Data

US 2024/0054258 A1 Feb. 15, 2024

(51) Int. Cl.
*G06F 30/20* (2020.01)
*G07C 5/00* (2006.01)

(52) U.S. Cl.
CPC .............. *G06F 30/20* (2020.01); *G07C 5/008* (2013.01)

(58) Field of Classification Search
CPC .......... G06F 30/20; G06F 30/15; G07C 5/008
See application file for complete search history.

(56) References Cited

FOREIGN PATENT DOCUMENTS

DE 102020134185 A1 * 6/2022 ........... G06F 15/163
WO WO-2022258215 A1 * 12/2022 ........... G06F 11/261

OTHER PUBLICATIONS

Yuan R, Xiao C, Liu M, Chen J, Yu M. Can message unpack and pack based on simulink automatic code generation technology. InJournal of Physics: Conference Series May 1, 2022 (vol. 2232, No. 1, p. 012009). IOP Publishing. 7 Pages. (Year: 2022).*

Ruan, Yifan. "A Co-Simulation Framework for Black-box Testing of In-Vehicle ECUs." Degree Project in Electrical Engineering, Second Cycle, 30 Credits Stockholm, Sweden 2019(2019). 78 Pages. (Year: 2019).*

* cited by examiner

*Primary Examiner* — Eunhee Kim
(74) *Attorney, Agent, or Firm* — LEYDIG, VOIT & MAYER, LTD.

(57) ABSTRACT

A system for real-time simulation includes: a real-time computing device configured to execute the real-time simulation; and a host computing device in communication with the real-time computing device. The host computing device is configured to: configure a real-time simulation application for executing the real-time simulation; and send the real-time simulation application to the real-time computing device. The real-time computing device is further configured to, as part of executing the real-time simulation: receive a message corresponding to a data array to a buffer of the real-time computing device; unpack the message in the buffer; determine that an unpack trigger corresponding to the data array has been activated; and in response to determining that the unpack trigger corresponding to the data array has been activated, re-unpack the message in the buffer.

17 Claims, 7 Drawing Sheets

Host Computing Device
110

Processor(s)
160

Communication
Interface(s)
180

Memory(ies)
170

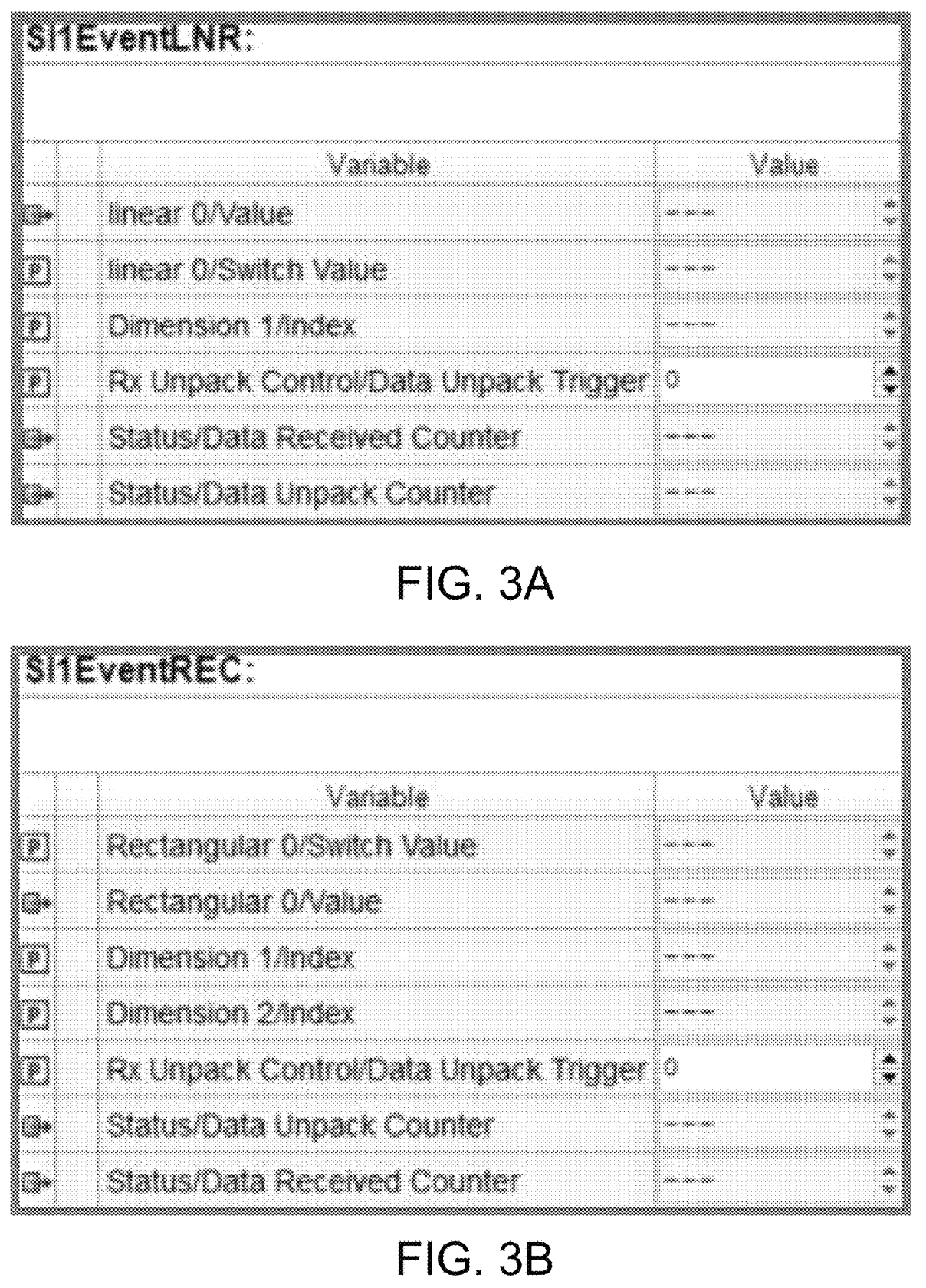

Si1EventLNR:

| | Variable | Value |
|---|---|---|
| | linear 0/Value | — — — |
| P | linear 0/Switch Value | — — — |
| P | Dimension 1/Index | — — — |
| P | Rx Unpack Control/Data Unpack Trigger | 0 |
| | Status/Data Received Counter | — — — |
| | Status/Data Unpack Counter | — — — |

FIG. 3A

Si1EventREC:

| | Variable | Value |
|---|---|---|
| P | Rectangular 0/Switch Value | — — — |
| | Rectangular 0/Value | — — — |
| P | Dimension 1/Index | — — — |
| P | Dimension 2/Index | — — — |
| P | Rx Unpack Control/Data Unpack Trigger | 0 |
| | Status/Data Unpack Counter | — — — |
| | Status/Data Received Counter | — — — |

FIG. 3B

402: real-time computing device receives message from ECU

404: real-time computing device unpacks message (deserializes current index)

406b: host computing device changes index variable and toggles unpack trigger

408b: real-time computing device re-unpacks latest message such that signal value variable becomes consistent with the changed index variable

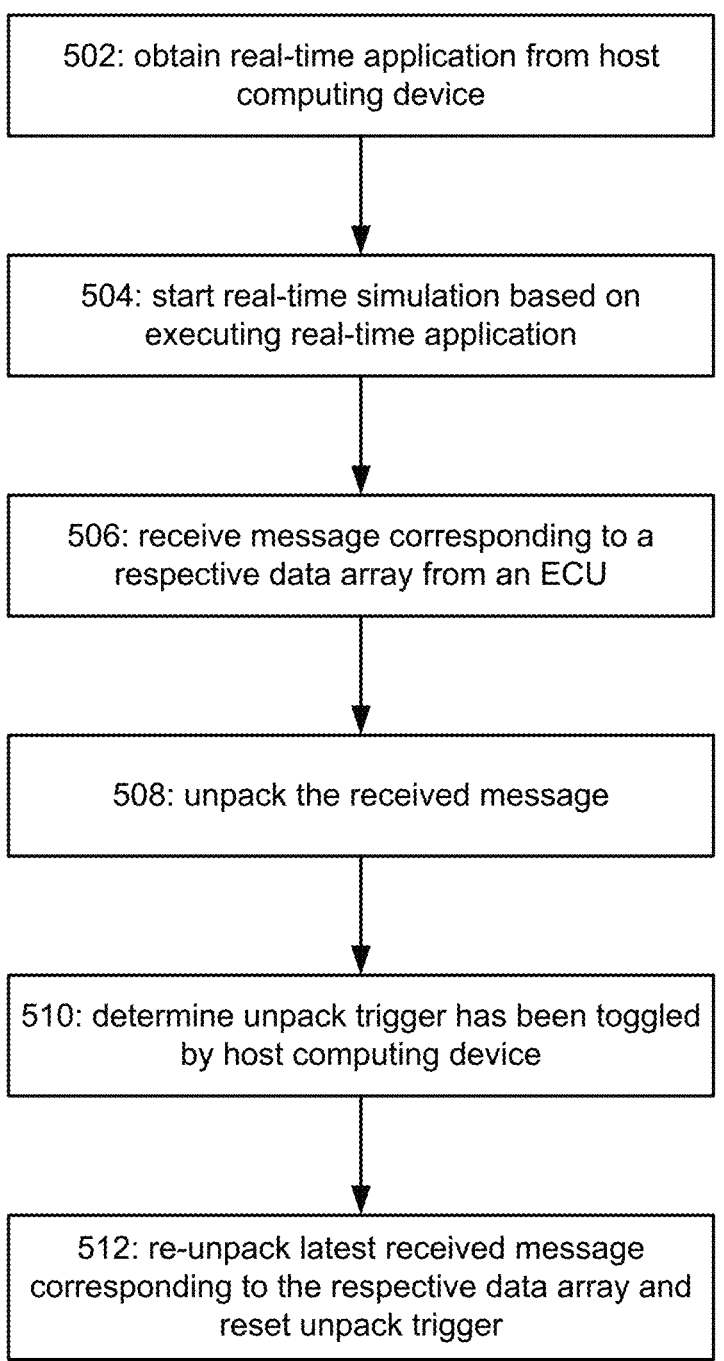

502: obtain real-time application from host computing device

504: start real-time simulation based on executing real-time application

506: receive message corresponding to a respective data array from an ECU

508: unpack the received message

510: determine unpack trigger has been toggled by host computing device

512: re-unpack latest received message corresponding to the respective data array and reset unpack trigger

FIG. 5

UNPACK TRIGGER FOR TESTING ELECTRONIC CONTROL UNITS

BACKGROUND

The development of electronic control units, such as for autonomic driving applications, is a complex process. New electronic control units and new control functions are tested during the development process to verify their functionality and to set the direction for further development. As part of the development process, an electronic control unit is tested as comprehensively as possible in order to make modifications based on the test results before the control unit comes into use or enters mass production, so that it functions as desired under all conditions in later operation.

Hardware-in-the-loop (HIL) simulators are employed during the development process of electronic control units. Such HIL simulators may utilize one or more real-time computing devices to simulate an environment for one or more electronic control units under development, wherein the environment may include other electronic control units and components of a technical system.

An HIL simulator may contain a model of a technical system to be controlled, as well as other models of technical systems that are in the environment of an electronic control unit and that interact with the electronic control unit and/or the technical system to be controlled. The HIL simulator also contains an input/output interface to which it is possible to connect the electronic control unit, which has already undergone extensive development and is physically present as hardware, also called a hardware implementation of the control unit.

The functionality of the control unit can thus be tested in various simulation passes, wherein it is possible to observe how the electronic control unit reacts to events predefined by the model of the technical system to be controlled, and how the model of the technical system to be controlled reacts to the signals of the electronic control unit.

It is also possible to observe the behavior of other technical systems from the environment of the electronic control unit and the technical system to be controlled. In this process, it is possible to simulate not only normal operation, but also faults in the technical system to be controlled as well as faults in the control unit and faults in the communication between the control unit and the technical system to be controlled, such as, e.g., cable bridge, as well as faults in the power supply, such as, e.g., short circuits.

Performing real-time simulation on an HIL simulator is resource-intensive because it involves simulating operation of an electronic control unit within a technical system in real-time (that is, with predefined latency requirements), and the HIL simulator may have limited processing capability and bandwidth available to satisfy the latency requirements associated with real-time simulation (for example, the real-time computing device(s) of the HIL simulator may devote much of their processing resources to complex modeling, leaving little processing resources available for handling data exchange). As such, given the amount of data exchange operations which are to be completed in each respective timestep of a real-time simulation (e.g., within respective timesteps of 1 ms each), which may include reception, sending, deserialization, serialization, and other tasks which respect to messages (e.g., with sizes of a few bytes up to several megabytes) of continuous network traffic within a technical system, the real-time simulation is designed such that the simulation can be run as efficiently as possible, including inspection and modification of variables of the simulation.

However, in conventional HIL simulation systems, running the simulation as efficiently as possible for real-time processing may lead to desynchronization problems, as messages communicated within a simulated technical system may not be entirely unpacked at the time of receiving the message for performance reasons. Thus, changing an index variable within a host computing device for controlling and/or inspecting the simulation may result in the host computing device accessing a stale value which is no longer up-to-date within the simulation.

SUMMARY

In an exemplary embodiment, the present invention provides a system for real-time simulation, including: a real-time computing device configured to execute the real-time simulation; and a host computing device in communication with the real-time computing device. The host computing device is configured to: configure a real-time simulation application for executing the real-time simulation; and send the real-time simulation application to the real-time computing device. The real-time computing device is further configured to, as part of executing the real-time simulation: receive a message corresponding to a data array to a buffer of the real-time computing device; unpack the message in the buffer; determine that an unpack trigger corresponding to the data array has been activated; and in response to determining that the unpack trigger corresponding to the data array has been activated, re-unpack the message in the buffer.

In a further exemplary embodiment, the system further includes an electronic control unit (ECU) in communication with the real-time computing device, and the message received by the real-time computing device is received from the ECU.

In a further exemplary embodiment, the system further includes a sensor in communication with the ECU, wherein the data array includes measurement information from the sensor.

In a further exemplary embodiment, the system further includes another real-time computing device in communication with the real-time computing device, wherein the another real-time computing device is configured to simulate an ECU in communication with the real-time computing device.

In a further exemplary embodiment, the host computing device is configured to activate the unpack trigger in connection with changing an index variable corresponding to the data array.

In a further exemplary embodiment, the host computing device is configured to change the index variable and activate the unpack trigger via a trace (TRC) interface corresponding to a TRC file associated with the data array.

In a further exemplary embodiment, the real-time computing device is further configured to reset the unpack trigger upon re-unpacking the message.

In a further exemplary embodiment, the real-time computing device is further configured to increment an unpack counter upon unpacking the message, and to increment the unpack counter again upon re-unpacking the message.

In a further exemplary embodiment, the real-time computing device is further configured to: in response to determining that the unpack trigger corresponding to the data array has been activated and that a new message corresponding to the data array has been received contemporaneously with the unpack trigger being activated, unpack the new message corresponding to the data array.

In a further exemplary embodiment, unpacking the message comprises deserializing a first signal value of the data array corresponding to a first position of the data array designated by a first value of an index variable, and re-unpacking the message comprises deserializing a second signal value of the data array corresponding to a second position of the data array designated by a second value of the index variable.

In a further exemplary embodiment, unpacking the message does not include deserializing any other signal values of the data array other than the first signal value, and re-unpacking the message does not include deserializing any other signal values of the data array other than the second signal value.

In another exemplary embodiment, the present invention provides a method for executing a real-time simulation on a real-time computing device. The method includes: obtaining, by the real-time computing device, a real-time application from a host computing device; starting, by the real-time computing device, the real-time simulation based on executed the real-time application; and during running of the real-time simulation: receiving a message corresponding to a data array to a buffer of the real-time computing device; unpacking the message in the buffer; determining that an unpack trigger corresponding to the data array has been activated; and in response to determining that the unpack trigger corresponding to the data array has been activated, re-unpacking the message in the buffer.

In yet another exemplary embodiment, the present invention provides a non-transitory computer-readable medium having processor-executable instructions stored thereon for executing a real-time simulation on a real-time computing device. The processor-executable instructions, when executed, facilitate: obtaining, by the real-time computing device, a real-time application from a host computing device; starting, by the real-time computing device, the real-time simulation based on executed the real-time application; and during running of the real-time simulation: receiving a message corresponding to a data array to a buffer of the real-time computing device; unpacking the message in the buffer; determining that an unpack trigger corresponding to the data array has been activated; and in response to determining that the unpack trigger corresponding to the data array has been activated, re-unpacking the message in the buffer.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIGS. 3A-3B depict examples of TRC interfaces displayed by ControlDesk simulation control software in accordance with exemplary embodiments of the present disclosure.

FIG. 5 is a flowchart illustrating an exemplary process performed on a real-time computing device for keeping a signal value parameter consistent with an index variable parameter during a real-time simulation in accordance with an exemplary embodiment of the present disclosure.

DETAILED DESCRIPTION

Figures 1A, 1B:
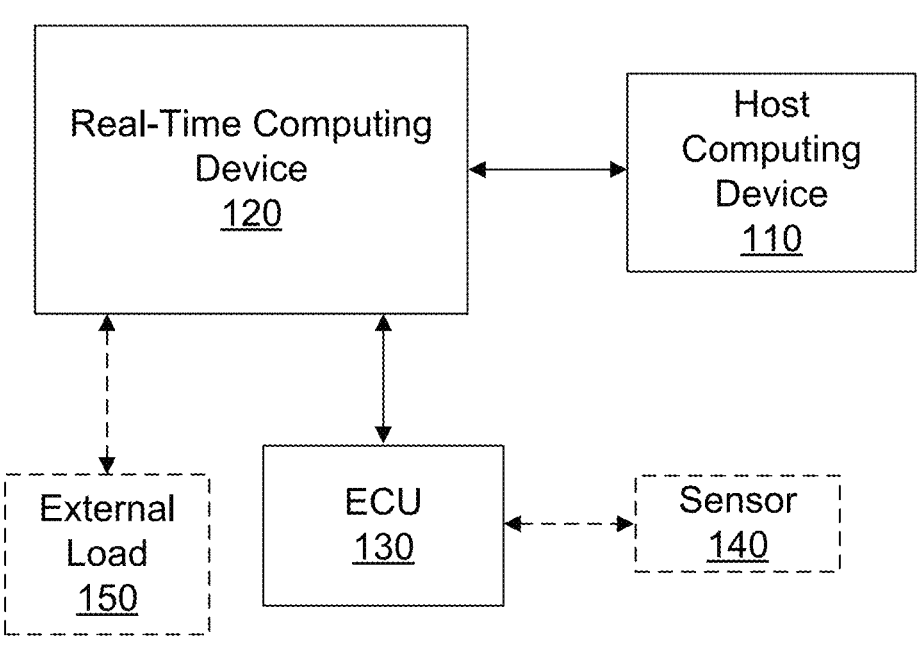
FIG. 1A is a block diagram depicting an example of an HIL simulation system for which exemplary embodiments of the present disclosure may be utilized.
FIG. 1B is a block diagram depicting components of an exemplary host computing device.

Many computing systems, such as for vehicles, involve electronic control units (ECUs) which are in communication with one another and with other hardware, such as sensors. To develop and test such systems and the components thereof, simulations may be run using simulated and/or real components. For computing systems utilized in time-critical applications, such as for vehicles, real-time simulation may be utilized.

To perform a real-time simulation, a toolchain may be utilized to configure and carry out the simulation. The toolchain may include configuration software, such as dSPACE's Ethernet Configuration Package (ETHCP) software, which generates runtime code for simulating ECUs in a real-time simulation. The generated runtime code can then be compiled using compiling software, such as dSPACE's ConfigurationDesk software, into an application which can be downloaded to a real-time computing device, such as dSPACE's SCALEXIO real-time personal computer (PC). The simulation can be controlled using control software, such as dSPACE's ControlDesk.

The complete toolchain including the simulation may be run in a fully automated manner using scripts, including for hardware-in-the-loop (HIL) simulations. The toolchain may also be utilized for manual configuration of the simulation and manual inspection or adjustment of variables while the simulation is being run.

During a simulation, sending and receiving messages between components (which may include simulated ECU(s), real ECU(s), and/or other components) may occur in the form of byte streams. When a message is received, bytes in the message are deserialized into structures of simple datatypes, such as those provided in AUTOSAR description files (arxml files). In a real-time simulation, to speed up processing, the structures of simple datatypes are organized as a data array, such that a relatively small trace file (TRC) interface may be accessible to the user (e.g., the TRC interface may be accessed by the user through a graphical user interface of simulation control software or accessed by an automated script prepared by a user). That is, the TRC interface provides an index variable and a signal value variable, such that an entire data array in a message does not need to be deserialized upon reception of the message; instead, the index variable (set by the user) results in only the signal value variable corresponding to the position in the data array designated by the index variable being deserialized upon reception of the message. Thus, instead of having a respective signal value variable for every signal value of a data array, resulting in a potentially large number of signal value variables being accessed and a large amount of deserialization processing each time a message is received (along with a large amount of memory needed to store the variables), configuring the TRC interface to provide the index variable with a single signal value variable (or a limited number of signal value variables) achieves faster processing to facilitate real-time simulation.

It will be appreciated that a "data array" as used herein may refer to any set of data having sub-units capable of being indexed or referenced, including both simple and complex types of data, as well as nested data arrays.

As mentioned above in the background section, a user may change an index variable while a simulation is ongoing. This results in a potentially problematic period of time between the index variable being changed and receiving a new message during which the signal value variable reflects a stale value that may not be up-to-date (see FIG. 4A and corresponding discussion below). A user (whether manually or through scripts) would then have to keep track of changes to index variables and the timing of data being received to avoid accessing stale data.

Exemplary embodiments of the present disclosure provide an unpack trigger variable within a TRC interface for an array which allows a user to trigger (manually or automatically through a script) a latest (i.e., most recent) message corresponding to the array being re-unpacked to update a signal value variable of the TRC interface, for example, upon the user changing an index variable of the TRC interface. Based on re-unpacking the latest message corresponding to the array (i.e., re-reading that latest message), the value indicated by the signal value variable is updated to reflect the current and correct value at the position in the array designated by the index variable of the TRC interface. Accordingly, exemplary embodiments of the present disclosure are able to avoid the existence of a problematic period of time between an index variable being changed and receiving a new message during which the signal value variable reflects a stale value that may not be up-to-date.

FIG. 1A depicts an example of an HIL simulation system for which exemplary embodiments of the present disclosure may be utilized. The HIL system includes a host computing device 110 (also referred to as a "host PC"), a real-time computing device 120 (such as a SCALEXIO real-time PC), and an ECU 130 to be tested or developed.

The real-time computing device 120 may be configured to simulate a real-time environment for the ECU 130. For example, the real-time computing device 120 may be configured to:

generate sensor signals for the ECU 130, measure signals which are generated by the ECU 130 for actuator control;

connect the output signals of the ECU 130 to loads (e.g., to an internal load in the real-time computing device 120 or an external load 150 connected to the real-time computing device) to simulate actuators;

receive bus signals sent by the ECU 130;

send bus signals to the ECU 130;

simulate virtual ECUs (V-ECUs) which interact with the ECU 130;

provide battery voltage to the ECU 130; and/or simulate electrical errors in the wiring of the ECU 130.

The simulated environment for the ECU 130 may further include sensors simulated by the real-time computing device 120, and/or the ECU 130 may further be connected to a real hardware sensor 140.

The behavior of the controlled system is specified by a real-time application which runs on the processing hardware of the real-time computing device 120. The real-time application may be created on the host computing device 110 and downloaded to the real-time computing device 120 via a network connection (e.g., via an Ethernet connection).

The host computing device 110 may be configured to run software tools which work with the real-time computing device 120. For example, the host computing device 110, through execution of the software tools, may be configured to:

create a real-time application that models the controlled system;

implement the real-time application on the real-time computing device 120;

manage the real-time application on the real-time computing device 120;

change variable values of the real-time application, for example, to simulate different car variants;

measure variables of the real-time application, for example, to analyze the signals for actuators; and/or control an electrical error simulation in the real-time computing device 120.

It will be appreciated that the exemplary environment depicted in FIG. 1A is merely an example, and that many other configurations of a real-time HIL simulation environment are possible. For example, multiple real-time computing devices and/or multiple ECUs may be included in the real-time HIL simulation system. Additionally, it will be appreciated that the HIL simulation environment depicted in FIG. 1A may also be used for replaying data for validating a real ECU.

FIG. 1B depicts components of an exemplary host computing device 110. The host computing device 110 may include one or more processors 160, one or more communication interfaces 180, and one or more memories 170. The processor(s) 160 may be configured to perform the operations in accordance with processor-executable instructions stored in memory(ies) 170. The processor(s) 160 may include any appropriate type of general-purpose or special-purpose microprocessor, such as a central processing unit (CPU), a graphic processing unit (GPU), a parallel processing unit (PPU), etc. The memory(ies) 170 may be configured to store computer-readable instructions that, when executed by the processor(s) 160, cause the processor(s) 160 to perform various operations disclosed herein. The memory(ies) 170 may be any non-transitory type of mass storage, such as volatile or non-volatile, magnetic, semiconductor-based, tape-based, optical, removable, non-removable, or other type of storage device or tangible computer-readable medium including, but not limited to, a read-only memory ("ROM"), a flash memory, a dynamic random-access memory ("RAM"), and/or a static RAM.

The communication interface(s) 180 may be configured to communicate information between the host computing device 110 and other devices or systems, such as the other components shown in FIG. 1A. For example, the communication interface(s) 180 may include a cable modem, a satellite modem, or a modem to provide a data communication connection. As another example, the communication interface(s) 180 may include a local area network ("LAN") card to provide a data communication connection to a compatible LAN. As a further example, the communication interface(s) 180 may include a high-speed network adapter such as a fiber optic network adaptor, 10G Ethernet adaptor, or the like. Wireless links can also be implemented by the communication interface(s) 180. In such an implementation, the communication interface(s) 180 can send and receive electrical, electromagnetic or optical signals that carry digital data streams representing various types of information via a network. The network can typically include a cellular communication network, a Wireless Local Area Network ("WLAN"), a Wide Area Network ("WAN"), or the like.

The communication interface(s) 180 may also include various I/O devices such as a keyboard, a mouse, a touchpad, a touch screen, a microphone, a camera, a biosensor, etc. A user may input data to the host computing device 110 through the communication interface(s) 180.

In some embodiments, a display may be integrated as part of the host computing device 110 or may be provided as a separate device communicatively coupled to the host computing device 110. The display may include a display device such as a Liquid Crystal Display ("LCD"), a Light Emitting Diode Display ("LED"), a plasma display, or any other type of display, and provide a Graphical User Interface ("GUI") presented on the display for user input and data depiction. In some embodiments, the display may be integrated as part of the communication interface(s) 180.

It will be appreciated that the real-time computing device 120 may also include one or more processors, one or more memories, and one or more communication interfaces.

Figure 2:
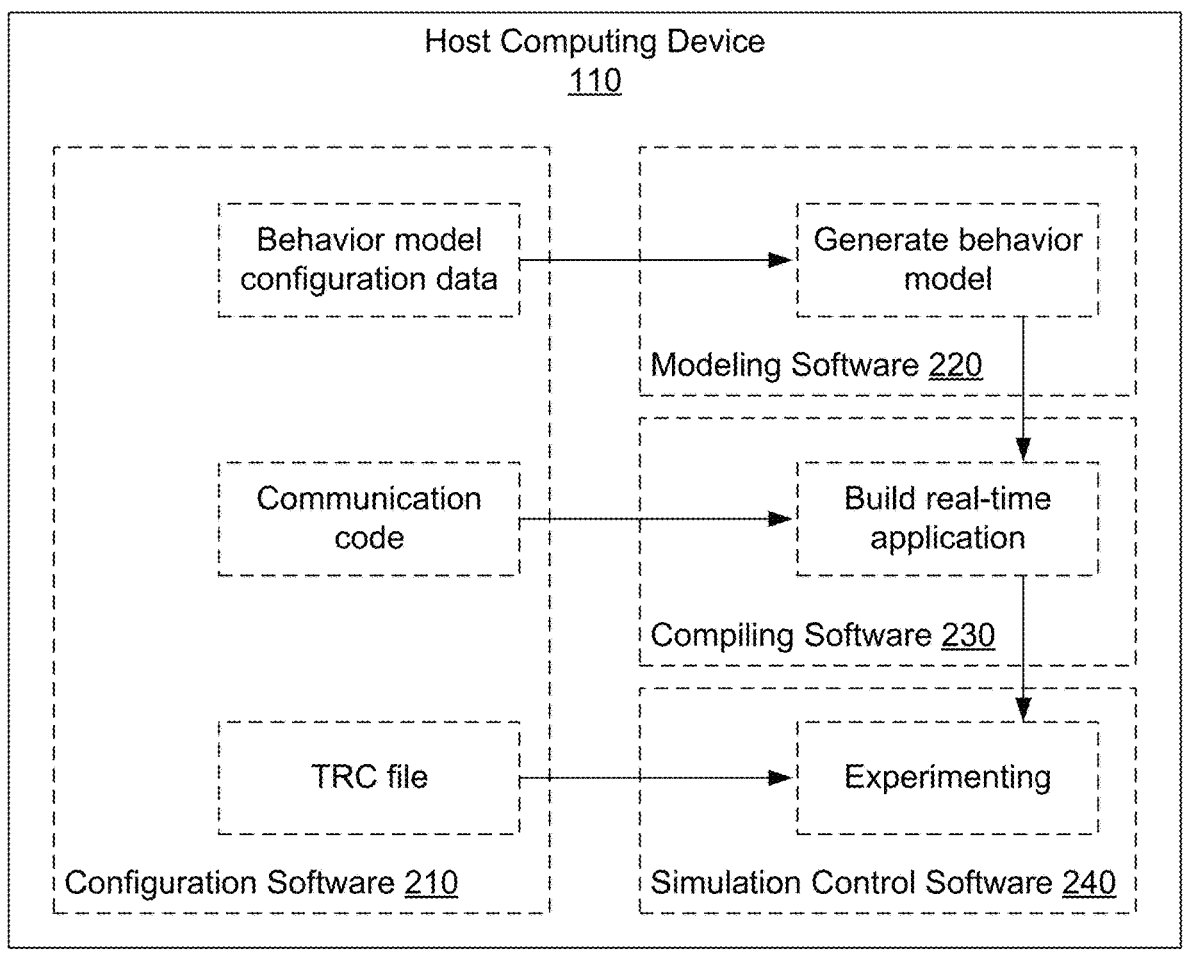
FIG. 2 is a block diagram depicting an example of a toolchain implemented on the host computing device of FIGS. 1A-1B.

FIG. 2 depicts an example of a toolchain implemented on the host computing device of FIGS. 1A-1B. The toolchain includes, for example, configuration software 210 (e.g., Ethernet Configuration Tool), modeling software 220 (e.g., MathWorks' Simulink), compiling software 230 (e.g., ConfigurationDesk), and simulation control software 240 (e.g., ControlDesk).

The configuration software 210 may be configured to perform a configuration process, which includes creation of behavior model configuration data (e.g., Simulink configuration data), communication code, and a trace (TRC) file.

The modeling software 220 may utilize the behavior model configuration data to model behavior for the simulation model (i.e., the controlled system) to be run on the real-time computing device and thereby generate a behavior model.

The compiling software 230 may utilize the communication code created by the configuration software 210 and provide for implementing an I/O model on the real-time computing device. For example, using the compiling software 230, the I/O signals of the simulation model may be mapped to external devices and vice versa, and the functions to be supported by the real-time computing device can be selected and configured. The compiling software 230 may further provide for building the real-time application containing both the behavior model from the modeling software 220 and the I/O model. The real-time application is then downloaded to the real-time computing device acting as the simulator for testing the ECU.

The simulation control software 240 provides for experimenting using the real-time computing device. The simulation control software 240 may be used, for example, to download the real-time application, calibrate variables, and measure signals. The experimenting utilizes the TRC file generated by the configuration software 210.

The TRC file may also be referred to as a variable description file, and the TRC file may be implemented as an ASCII file which specifies variables and measurements available on the real-time hardware. That is, the TRC file provides information regarding variables of a real-time application for connecting those variables to instruments in a layout of the simulation control software, accessing variables in test software, etc. It will be appreciated that the TRC file may be generated automatically as part of configuring the simulation or may be written manually.

As mentioned above, a user interacts with a TRC interface (which is based on a respective TRC file) when inspecting or controlling a simulation (whether manually or in an automated manner through using scripts, such as Python scripts). According to exemplary embodiments of the present disclosure, the TRC file is configured with an unpack trigger variable such that a user (e.g., through a user interface or through a script) may toggle the unpack trigger variable of a respective TRC interface corresponding to an array in connection with changing an index variable of the respective TRC interface corresponding to the array when the user wants to ensure that a signal value variable of the respective TRC interface corresponding to the array reflects a correct, up-to-date signal value corresponding to the position of the array designated by the changed index variable.

The TRC file may further include an unpack counter which is displayed as part of the TRC interface. The unpack counter is a counter which is increased every time a message corresponding to the respective array is unpacked, which can be based on reception of a new message corresponding to the respective array or a re-unpacking of a latest message corresponding to the respective array triggered based on the unpack trigger variable. The unpack counter is thus usable by a user or a script to determine whether or not a signal value has been updated, such that, for example, a script may include code for waiting on checking a variable until after the unpack counter is incremented (thereby indicating that a corresponding signal value variable is up to date). It will be appreciated that, alternatively, a user or a script may rely on checking whether a message received counter has been incremented (for an indication that a newly received message has been unpacked) and rely on checking whether an unpack trigger has been reset (for an indication that a re-unpack has been completed). Thus, for example, a script may use the unpack counter as a state indicator and poll the unpack counter to determine when an unpack has finished.

FIGS. 3A-3B depict examples of TRC interfaces displayed by ControlDesk simulation control software in accordance with exemplary embodiments of the present disclosure. These TRC interfaces include variable displays and controls which enable a user to inspect and/or change variable values using the simulation control software, whereby changing a variable value affects the simulation being carried out on the real-time simulation system. Thus, using these TRC interfaces (as well as other types of TRC interfaces provided by the simulation control software such as graphs, simple number displays, or speedometer graphics) allow users to inspect and manipulate information pertaining to an ongoing real-time simulation. The "SI1EventLNR" TRC interface shown in FIG. 3A is an example of a TRC interface for a one-dimensional array, as it can be seen in FIG. 3A that "SI1EventLNR" includes only one index variable ("Dimension 1/Index"). The "SI1EventREC" TRC interface shown in FIG. 3B is an example of a TRC interface for a two-dimensional array, as it can be seen in FIG. 3B that "SI1EventLNR" includes two index variables ("Dimension 1/Index" and "Dimension 2/Index"). It will be appreciated that TRC interfaces may also include three or more index variables for arrays which have three or more dimensions. Further, it will be appreciated that data arrays may involve simple objects such as integers, or may involve more complex objects (e.g., in the case of nested arrays).

The TRC interface of FIG. 3A further includes a signal value variable ("linear 0/Value"), through which a user may inspect or modify a signal value of the array at a respective position within the array designated by the one index variable of FIG. 3A ("Dimension 1/Index"). Similarly, the TRC interface of FIG. 3B further includes a signal value variable ("Rectangular 0/Value"), through which a user may inspect or modify a signal value of the array at a respective position within the array designated by the two index variables of FIG. 3B ("Dimension 1/Index" and "Dimension 2/Index").

In accordance with exemplary embodiments of the present disclosure, each of the TRC interfaces shown in FIGS. 3A and 3B includes an unpack trigger variable. As discussed above, the unpack trigger variable may be toggled by a user to trigger the latest message corresponding to the array being re-unpacked (e.g., during a next time-step of an ongoing real-time simulation). For example, after the user changes an index variable in the TRC interface of FIG. 3A or index variable(s) in the TRC interface of FIG. 3B, if the user wants to ensure that the corresponding signal value variable is up to date with respect to the changed index variable, the user may set the unpack trigger variable to "1" (e.g., through the depicted TRC interface or through an automation script). The unpack trigger variable being set to "1" triggers the latest message corresponding to the respective array being re-unpacked (or "re-read") such that the signal value variable corresponding to the changed index variable is updated, and the unpack trigger variable is reset to "0" in response to the latest message corresponding to the respective array having been re-unpacked.

The TRC interfaces shown in FIGS. 3A and 3B further include an unpack counter variable ("Status/Data Unpack Counter") and a message received counter variable ("Status/Data Received Counter"). As discussed above, the unpack counter variable reflects the value of an unpack counter which is increased every time a message corresponding to the respective array is unpacked, which can be based on reception of a new message corresponding to the respective array or a re-unpacking of a latest message corresponding to the respective array triggered based on the unpack trigger variable. The message received counter variable is similar to the unpack counter variable, except that the message received counter variable reflects the value of a message received counter which is increased every time a newly received message corresponding to the respective array is unpacked (i.e., the message received counter is incremented based on reception of a new message corresponding to the respective array but not based on a re-unpacking of a latest message corresponding to the respective array triggered based on the unpack trigger variable).

The TRC interfaces shown in FIGS. 3A and 3B further include a switch value variable ("linear 0/Switch Value" and "Rectangular 0/Switch Value") which, for example, may include a "1" or "0" to indicate whether deserialization for the corresponding signal value variable is activated or deactivated. For example, a user may use the switch value variable (whether manually or through a script) to deactivate unpacking for a respective signal value variable to avoid unneeded data unpacks for a respective value which may not be of interest for a particular scenario.

Figure 4A:
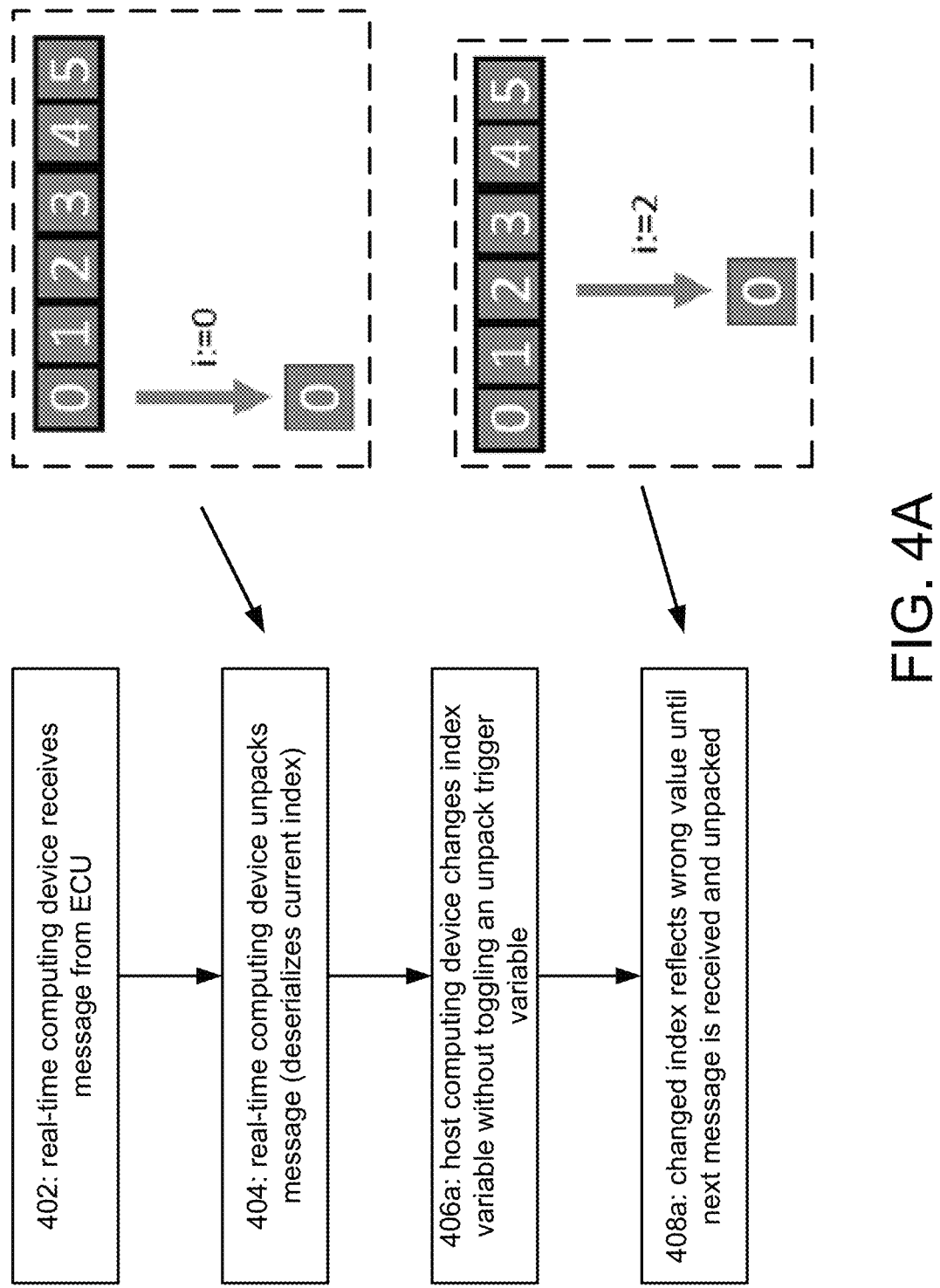
FIGS. 4A-4B are flowcharts illustrating examples of performing a real-time simulation involving a data array without utilizing an unpack trigger variable and with utilizing an unpack trigger variable.
Figure 4B:
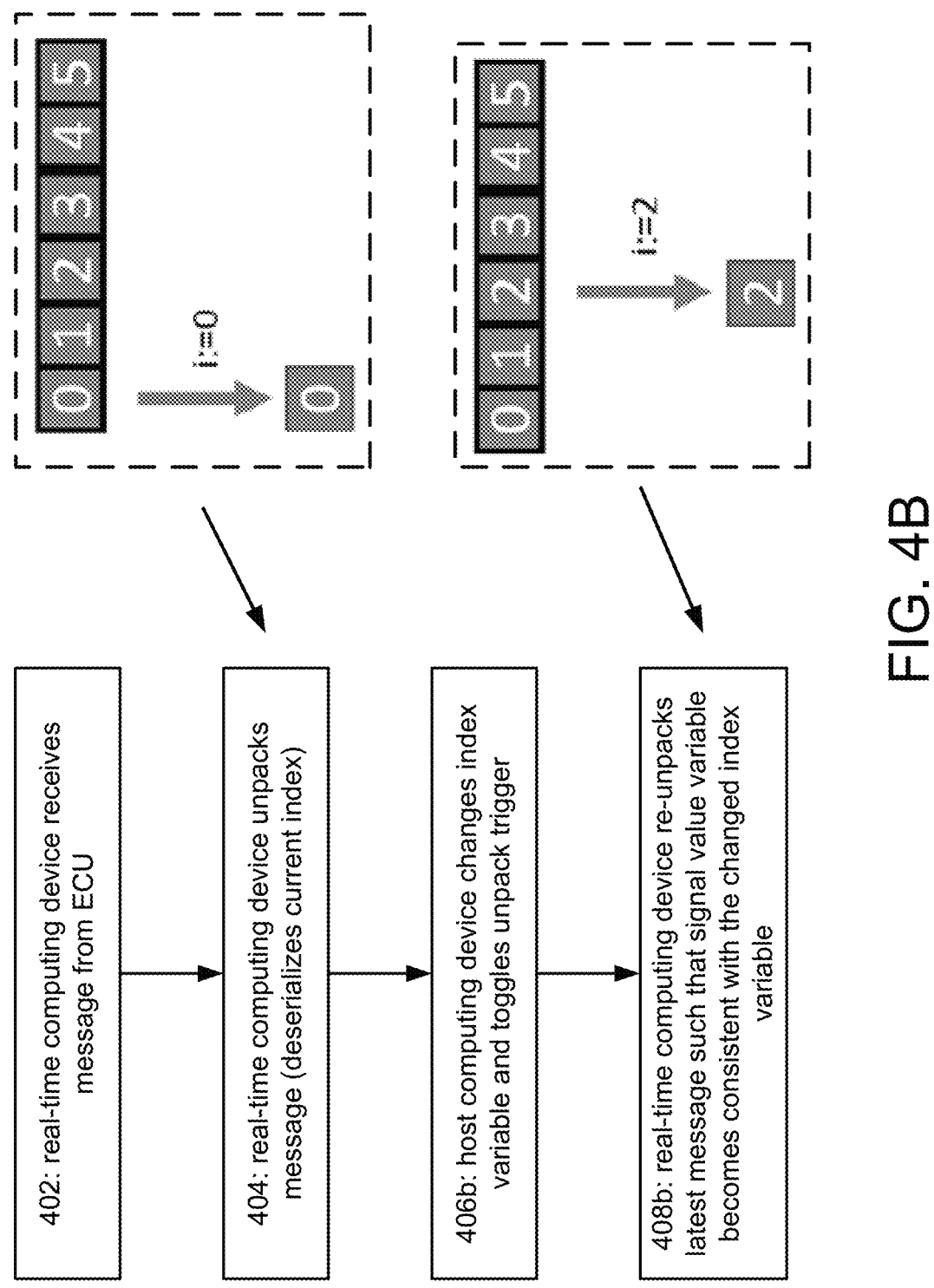

FIGS. 4A-4B are flowcharts illustrating examples of performing a real-time simulation involving a data array without utilizing an unpack trigger variable and with utilizing an unpack trigger variable. In this example, the data array is one-dimensional, with indices from 0 to 5 and storing values from 0 to 5, as shown in the table below:

TABLE 1

| Example Data Array | |
| --- | --- |
| Index | Signal Value |
| 0 | 0 |
| 1 | 1 |
| 2 | 2 |
| 3 | 3 |
| 4 | 4 |
| 5 | 5 |

As shown in FIG. 4A, as part of an ongoing real-time simulation which is configured and run on a real-time simulation system (e.g., as discussed above in connection with FIGS. 1A and 2), at stage 402, a real-time computing device receives a message pertaining to the data array from an ECU (e.g., which may be a real ECU being tested in an HIL system, or which may be a virtual ECU simulated by another real-time computing device) and stores the message in a buffer of the real-time computing device.

At stage 404, the real-time computing device, as part of the simulation, unpacks the received message stored in the buffer, which includes deserializing the signal value at the current index (without deserializing signal values at other indices) such that a host computer in communication with the real-time computing device is able to inspect a signal value corresponding to a current index of the data array. For example, as shown in FIG. 4A, the index variable of a TRC interface corresponding to the data array may be currently set to 0, and upon unpacking the received message, the host computer determines that the signal value corresponding to the index variable is also 0.

At stage 406a, a user using the host computer (e.g., a user interacting with a graphical user interface provided by simulation control software such as ControlDesk) or a script executed on the host computer (e.g., a Python script) changes the index variable to 2 without toggling an unpack trigger variable (for example, because the user chose not to toggle the unpack trigger variable or because the host computer is part of a conventional system lacking this feature). As a result, at stage 408a, for a period of time until a next message corresponding to the data array is received and unpacked, the signal value variable reflects an incorrect value of 0, which is not consistent with the changed index variable which is set to 2 (the actual signal value of the data array indicated by the received message at index 2 is 2).

Stages 402 and 404 of FIG. 4B are similar to stages 402 and 404 of FIG. 4A. However, at stage 406b of FIG. 4B, a user using the host computer (e.g., a user interacting with a graphical user interface provided by simulation control software such as ControlDesk) or a script executed on the host computer (e.g., a Python script) changes the index variable to 2 and toggles an unpack trigger variable. As a result, at stage 408a, in response to the unpack trigger variable being toggled, the real-time computing device re-unpacks a latest message corresponding to the data array which is stored in the buffer of the real-time computing device, resulting in deserialization of the signal value corresponding to the changed index of 2, such that the signal value variable of the TRC interface for the data array becomes consistent with the changed index variable without having to wait for a new message corresponding to the data array being received. That is, for the example data array in Table 1, the signal value variable for the TRC interface is immediately updated to 2 in response to the index variable being changed to 2 as a result of the unpack trigger variable being toggled.

There may be a situation where the unpack trigger is toggled to trigger re-unpacking of a latest message corresponding to a data array, and at around the same time, a new message corresponding to the data array is received. In this case, in an exemplary embodiment of the present disclosure, unpacking the new message takes precedence over unpacking the previously received latest message, and in response to unpacking the new message, the unpack trigger variable is reset to 0 (upon unpacking of the new message, the signal value variable and the changed index variable are made consistent with one another, thereby obviating the need to perform re-unpacking according to the unpack trigger).

FIG. 5 is a flowchart illustrating an exemplary process performed on a real-time computing device for keeping a signal value parameter consistent with an index variable parameter during a real-time simulation in accordance with an exemplary embodiment of the present disclosure.

At stage 502, the real-time computing device obtains a real-time application from a host computing device (e.g., a real-time application configured and compiled in the manner discussed above in connection with FIG. 2). In an exemplary implementation, the real-time application may be configured for real-time simulation of a real ECU connected to a real sensor, for which the real-time computing device is connected to the real ECU. During the real-time simulation, sensoric information is fed to the sensor which communicates measurements to the real ECU, and the measurements are evaluated by the real ECU and communicated to the real-time computing device in the form of messages. In another exemplary implementation, the real-time application may be configured for real-time simulation of a brake assistant ECU which automatically brakes in case of collision warnings, whereby the brake assistant ECU is sent messages indicating a collision warning, and the brake assistant ECU is tested to ensure that it properly responds to such collision warnings with responsive messages for automatically braking. In yet another exemplary implementation, the real-time application may be configured for real-time simulation of an ECU that does not yet exist and is represented and simulated using another real-time computing device.

At stage 504, the real-time computing device starts a real-time simulation based on executing the real-time application (e.g., based on a user controlling the real-time computing device through the host computing device). The real-time simulation may have certain latency requirements and be run in timesteps of around 0.001 s each. During each time step, various tasks are processed by the real-time computing device (including, for example, reception of messages, sending of messages, deserialization of message, and other tasks), and the real-time computing device may also facilitate inspection and manipulation of variables involved in the simulation through simulation control software executed on the host computing device. Overall, the ongoing real-time simulation may include simulation of continuous network traffic including hundreds of messages of varying sizes (e.g., from a few bytes up to several megabytes).

At stage 506, during running of the real-time simulation, the real-time computing device receives a message corresponding to a respective data array from an ECU as part of the simulation, and the message is stored to a buffer of the real-time computing device. In an exemplary implementation, the respective data array may be preprocessed sensor data including multiple types of information, such as distance and angle information (e.g., from a radar or Lidar sensor). An example of raw data from a sensor is shown below in Table 2:

TABLE 2

| Sample Sensor Data | | |
| --- | --- | --- |
| Distance | Angle | Intensity |
| 42 | 10 | 20 |
| 47.5 | 0 | 10 |
| 20 | 5 | 15 |
| 25 | 13.5 | 42 |
| 13 | 13 | 13 |
| 22 | 45 | 33 |
| 20 | 48 | 36 |
| 21 | 46 | 39 |
| 25 | 60 | 40 |
| 25 | −10 | 35 |
| 20 | −5 | 24 |
| 20 | −12.5 | 26 |
| 20 | −23 | 27 |
| 20 | −45 | 28 |
| 20 | −60 | 30 |
| 20 | −135 | 32 |

Table 2 data is preprocessed to get to an object corresponding to a data array, and Table 3 provides an example of the structure of the object usable in the real-time simulation, wherein the structure of the object includes various variable definitions. The structure may be defined, for example, in C-Code, and a respective object may be used as the target of deserializations from byte-buffers. An example of the structure of an object is shown below in Table 3:

TABLE 3

| Sample Structure |
| --- |

```
typedef struct {
    Float64 Distance;
    Float64 Angle;
} dSPACE_Position_T;
typedef struct {
    dSPACE_Position_T Position;
    UInt32 Classification;
    UInt32 CollisionWarning;
    UInt32 Index;
} dSPACE_Detections_T;
```

Figure 6:
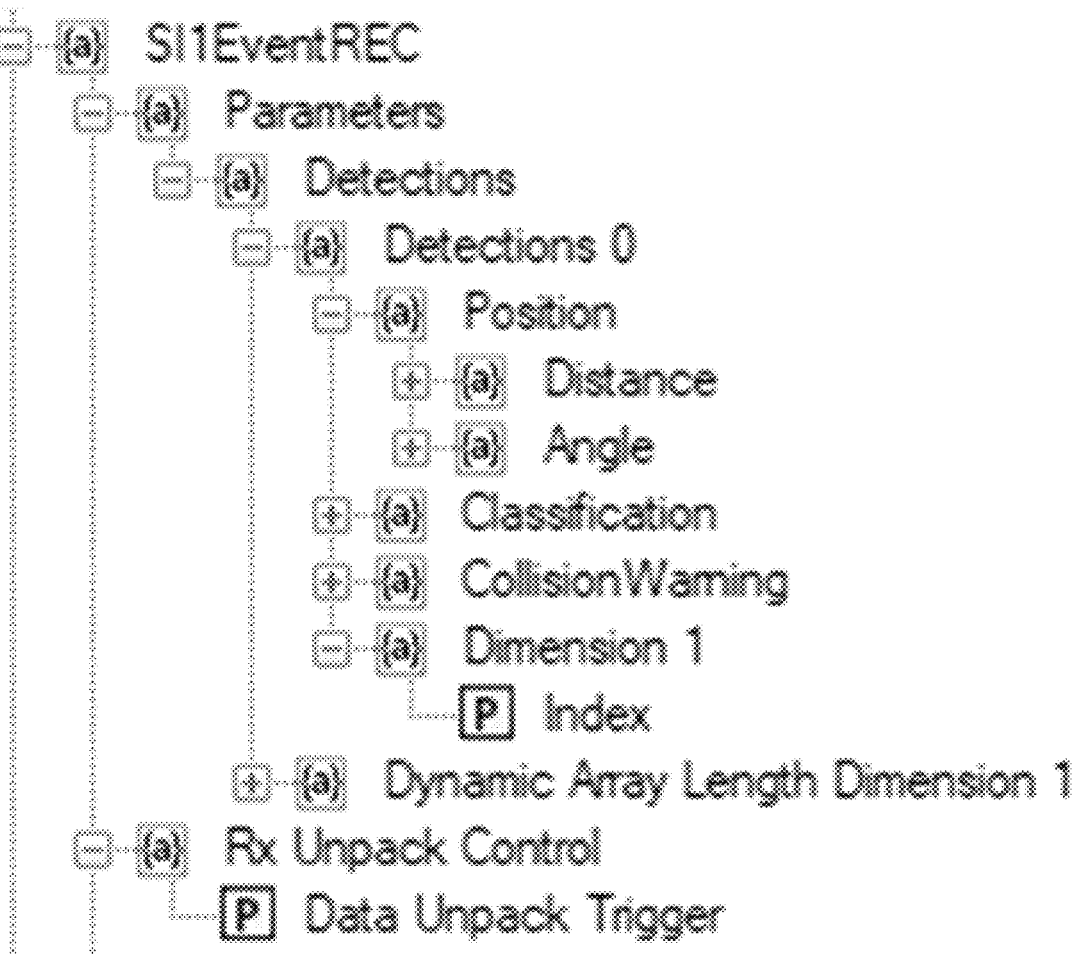
FIG. 6 depicts an example of part of a TRC file.

The TRC interface is configured according to a TRC file containing elements of the object, and the TRC interface includes pointers (i.e., variables of the TRC interface) which point to addresses of the object structure. An example of a part of a TRC file is depicted in FIG. 6, which depicts an exemplary list of "detection" objects (see Table 3 above) as part of parameters of an SI1EventREC TRC interface, wherein these detections correspond to detection information obtained from a sensor connected to an ECU. It will be appreciated that a respective message may include a list of objects, and that the "detection" object shown in Table 3 and FIG. 6 is merely an example of one type of object.

At stage 508, the received message stored in the buffer is unpacked by the real-time computing device. Unpacking the received message may include deserializing a signal value of the data array contained in the message corresponding to a currently-selected index variable while not deserializing any other signal values of the data array contained in the message. The host computing device has access to the unpacked signal value based on a TRC file corresponding to the respective data array.

At stage 510, the real-time computing device determines that the unpack trigger has been toggled by the host computing device (e.g., by a user manually interacting with a graphical TRC interface of simulation control software or through an automated script to set a value of an unpack trigger variable to "1", which causes the unpack trigger variable to be incremented on the real-time computing device) based on the real-time computing device checking for the value of the corresponding unpack trigger variable. For example, the real-time computing device may check, during every time-step of a real-time simulation, a plurality of unpack trigger variables corresponding to a plurality of TRC interfaces to determine whether one or more messages stored in a buffer of the real-time computing device are to be re-unpacked. In an exemplary implementation, a user may, for example, wish to browse through various detections and their properties via a provided TRC interface and compare the properties to provided sensor data. For a detection of interest, the user may, for example, change an index variable and also change the data unpack trigger variable to "1" to trigger deserialization of a latest message and update a corresponding signal value variable. It will be appreciated that, for a manual test, the user might only check a small part of the detections, whereas for an automatic test, a larger number of detections might be checked.

At stage 512, the real-time computing device re-unpacks the latest received message corresponding to the respective data array (which may be the message received at stage 506, which remains stored in the buffer) and resets the unpack trigger (e.g., by resetting a value of the unpack trigger variable to "0") upon completing the re-unpacking operation. After the latest received message is re-unpacked, the signal value variable of the TRC interface (accessed on the host computer by a user or script) for the respective data array reflects a consistent and up-to-date signal value corresponding to the changed index variable of the TRC interface. The real-time computing device may also increment an unpack counter variable upon completing the re-unpacking operation.

In view of the exemplary embodiments discussed and depicted above, it will be appreciated that by utilizing an unpack trigger variable in connection with real-time simulations involving data arrays, a signal value variable may be kept up-to-date and consistent with a corresponding changed index variable while allowing the real-time simulation to still comply with the latency requirements of being real-time and without introducing significant complexity into planning and configuring the real-time simulation.

All references, including publications, patent applications, and patents, cited herein are hereby incorporated by reference to the same extent as if each reference were individually and specifically indicated to be incorporated by reference and were set forth in its entirety herein.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a"

or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A system for real-time simulation, comprising:
a real-time computing device configured to execute the real-time simulation; and
a host computing device in communication with the real-time computing device, wherein the host computing device is configured to:
   configure a real-time simulation application for executing the real-time simulation; and
   send the real-time simulation application to the real-time computing device;
wherein the real-time computing device is further configured to, as part of executing the real-time simulation:
   receive a message corresponding to a data array to a buffer of the real-time computing device; and
   unpack the message in the buffer, wherein unpacking the message comprises deserializing a first signal value of the data array corresponding to a first position of the data array designated by a first value of an index variable;
wherein the host computing device is further configured to change a value of the index variable to a second value and activate an unpack trigger corresponding to the data array; and
wherein the real-time computing device is further configured to, as part of executing the real-time simulation:
   determine that the unpack trigger corresponding to the data array has been activated; and
   in response to determining that the unpack trigger corresponding to the data array has been activated, re-unpack the message in the buffer, wherein re-unpacking the message in the buffer comprises deserializing a second signal value of the data array corresponding to a second position of the data array designated by the second value of the index variable.

2. The system according to claim 1, further comprising:
an electronic control unit (ECU) in communication with the real-time computing device;
wherein the message received by the real-time computing device is received from the ECU.

3. The system according to claim 2, further comprising:
a sensor in communication with the ECU, wherein the data array includes measurement information from the sensor.

4. The system according to claim 1, further comprising:
another real-time computing device in communication with the real-time computing device, wherein the another real-time computing device is configured to simulate an ECU in communication with the real-time computing device.

5. The system according to claim 1, wherein the host computing device is configured to activate the unpack trigger in connection with changing an index variable corresponding to the data array.

6. The system according to claim 5, wherein the host computing device is configured to change the index variable and activate the unpack trigger via a trace (TRC) interface corresponding to a TRC file associated with the data array.

7. The system according to claim 1, wherein the real-time computing device is further configured to reset the unpack trigger upon re-unpacking the message.

8. The system according to claim 1, wherein the real-time computing device is further configured to increment an unpack counter upon unpacking the message, and to increment the unpack counter again upon re-unpacking the message.

9. The system according to claim 1, wherein the real-time computing device is further configured to:

in response to determining that the unpack trigger corresponding to the data array has been activated and that a new message corresponding to the data array has been received contemporaneously with the unpack trigger being activated, unpack the new message corresponding to the data array.

10. The system according to claim 1, wherein unpacking the message does not include deserializing any other signal values of the data array other than the first signal value, and wherein re-unpacking the message does not include deserializing any other signal values of the data array other than the second signal value.

11. A method for executing a real-time simulation on a real-time computing device, comprising:

obtaining, by the real-time computing device, a real-time application from a host computing device;

starting, by the real-time computing device, the real-time simulation based on executed the real-time application; and during running of the real-time simulation:

receiving a message corresponding to a data array to a buffer of the real-time computing device;

unpacking the message in the buffer, wherein unpacking the message comprises deserializing a first signal value of the data array corresponding to a first position of the data array designated by a first value of an index variable;

determining that an unpack trigger corresponding to the data array has been activated by the host computing device; and in response to determining that the unpack trigger corresponding to the data array has been activated, re-unpacking the message in the buffer, wherein re-unpacking the message in the buffer comprises deserializing a second signal value of the data array corresponding to a second position of the data array designated by a second value of the index variable.

12. The method according to claim 11, wherein the message is received from an electronic control unit (ECU) in communication with the real-time computing device; or wherein the message is received from another real-time computing device in communication with the real-time computing device, wherein the another real-time computing device simulates an ECU in communication with the real-time computing device.

13. The method according to claim 11, further comprising:

resetting the unpack trigger upon re-unpacking the message.

14. The method according to claim 11, wherein unpacking the message does not include deserializing any other signal values of the data array other than the first signal value, and wherein re-unpacking the message does not include deserializing any other signal values of the data array other than the second signal value.

15. A non-transitory computer-readable medium having processor-executable instructions stored thereon for executing a real-time simulation on a real-time computing device, wherein the processor-executable instructions, when executed, facilitate:

obtaining, by the real-time computing device, a real-time application from a host computing device;

starting, by the real-time computing device, the real-time simulation based on executed the real-time application; and during running of the real-time simulation:

receiving a message corresponding to a data array to a buffer of the real-time computing device;

unpacking the message in the buffer, wherein unpacking the message comprises deserializing a first signal value of the data array corresponding to a first position of the data array designated by a first value of an index variable;

determining that an unpack trigger corresponding to the data array has been activated by the host computing device; and in response to determining that the unpack trigger corresponding to the data array has been activated, re-unpacking the message in the buffer, wherein re-unpacking the message in the buffer comprises deserializing a second signal value of the data array corresponding to a second position of the data array designated by a second value of the index variable.

16. The non-transitory computer-readable medium according to claim 15, wherein the message is received from an electronic control unit (ECU) in communication with the real-time computing device; or wherein the message is received from another real-time computing device in communication with the real-time computing device, wherein the another real-time computing device simulates an ECU in communication with the real-time computing device.

17. The non-transitory computer-readable medium according to claim 15, wherein the processor-executable instructions, when executed, further facilitate:

resetting the unpack trigger upon re-unpacking the message.

* * * * *